US012765243B2

(12) United States Patent
Shi et al.

(10) Patent No.: US 12,765,243 B2
(45) Date of Patent: Oct. 13, 2026

(54) DISPLAY PANEL, MANUFACTURING METHOD THEREFOR, AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Quan Shi, Beijing (CN); Bo Shi, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 229 days.

(21) Appl. No.: 18/705,983

(22) PCT Filed: Apr. 25, 2023

(86) PCT No.: PCT/CN2023/090650
§ 371 (c)(1),
(2) Date: Apr. 29, 2024

(87) PCT Pub. No.: WO2023/207994
PCT Pub. Date: Nov. 2, 2023

(65) Prior Publication Data

US 2025/0133941 A1 Apr. 24, 2025

(30) Foreign Application Priority Data

Apr. 26, 2022 (CN) ......................... 202210449777.0

(51) Int. Cl.
*H10K 59/12* (2023.01)
*G02F 1/29* (2006.01)
(Continued)

(52) U.S. Cl.
CPC ............ *H10K 59/879* (2023.02); *G02F 1/29* (2013.01); *H10K 59/1201* (2023.02); *H10K 59/50* (2023.02); *H10K 59/873* (2023.02)

(58) Field of Classification Search
CPC ......................... H10K 59/879; H10K 59/1201
(Continued)

(56) References Cited

U.S. PATENT DOCUMENTS

2019/0115404 A1 4/2019 Moon et al.
2020/0105826 A1* 4/2020 Kim ..................... H10H 29/142
(Continued)

FOREIGN PATENT DOCUMENTS

CN 113054136 A 6/2021
CN 113964280 A 1/2022
(Continued)

OTHER PUBLICATIONS

International Search Report for PCT/CN2023/090650 Mailed Jun. 26, 2023.

*Primary Examiner* — Christopher M Raabe

(57) ABSTRACT

A display panel, a manufacturing method therefor, and a display apparatus. The display panel (100) comprises a light-emitting device layer (110), an encapsulation layer (120) and an optical regulation layer (130), which are successively stacked, the optical regulation layer (130) comprising first lens structures (131) located on the side of the encapsulation layer away from the light-emitting device layer, and a planarization layer (132) located on the sides of the first lens structures away from the light-emitting device layer, and on the exposed side of the encapsulation layer away from the light-emitting device layer, the surfaces of the sides of at least part of the first lens structures (131) away from the light-emitting device layer (110) having relief appearances.

19 Claims, 6 Drawing Sheets

(51) Int. Cl.
*H10K 59/50* (2023.01)
*H10K 59/80* (2023.01)

(58) Field of Classification Search
USPC .......................................................... 349/62
See application file for complete search history.

(56) References Cited

U.S. PATENT DOCUMENTS

| | | | | |
|---|---|---|---|---|
| 2022/0229209 | A1* | 7/2022 | Guo | G02B 3/0012 |
| 2024/0032398 | A1* | 1/2024 | Sun | H10K 59/879 |

FOREIGN PATENT DOCUMENTS

| | | | |
|---|---|---|---|
| CN | 114242913 | A | 3/2022 |
| CN | 114361367 | A | 4/2022 |
| CN | 117015259 | A | 11/2023 |

* cited by examiner

DISPLAY PANEL, MANUFACTURING METHOD THEREFOR, AND DISPLAY APPARATUS

CROSS-REFERENCE TO RELATED APPLICATION

The present application is a U.S. National Phase Entry of International Application No. PCT/CN2023/090650 having an international filing date of Apr. 25, 2023, which claims priority to application No. 202210449777.0 filed to the CNIPA on Apr. 26, 2022 and entitled "Display Panel, Manufacturing Method therefor, and Display Apparatus". Contents of the above-identified applications should be construed as being incorporated into the present application by reference.

TECHNICAL FIELD

Embodiments of the present disclosure relate to, but are not limited to, the field of display technologies, and in particular to a display panel, a manufacturing method therefor, and a display apparatus.

BACKGROUND

In the process of displaying a picture by a display apparatus, light is emitted from the display apparatus to the outside. Generally, a refractive index of an optical path region (such as a cover plate) inside the display apparatus is relatively high, and a refractive index of an optical path region (such as air) outside the display apparatus is relatively low. When an incident angle of light on a critical surface between the inner and outer optical path regions of the display apparatus reaches or exceeds the critical angle of total reflection, total internal reflection will occur in the display apparatus, resulting in low overall light emitting efficiency of the display apparatus.

In order to improve the light emitting efficiency of the display apparatus, an optical adjustment layer can be disposed in the optical path region of the display apparatus to adjust the incident angle of light on the critical surface between the inner and outer optical path regions of the display apparatus, so as to reduce the probability or degree of total internal reflection.

However, the display apparatus with an optical adjustment layer is prone to undesirable phenomena such as bubbles or cracks, and the reliability of the product is insufficient, which seriously affects the service life and display effect of the product.

SUMMARY

The following is a summary of subject matter described in the present disclosure in detail. This summary is not intended to limit the protection scope of claims.

An exemplary embodiment of the present disclosure provides a display panel including a light emitting device layer, an encapsulation layer and an optical adjustment layer that are sequentially stacked. The optical adjustment layer includes a first lens structure located on a side of the encapsulation layer away from the light emitting device layer, and a planarization layer located on a side of the first lens structure away from the light emitting device layer and on a side of an exposed encapsulation layer away from the light emitting device layer. At least a portion of a surface of the first lens structure away from the light emitting device layer has an undulating morphology.

In an exemplary implementation, the light emitting device layer includes a pixel definition structure, and a pixel unit enclosed by the pixel definition structure. A projection of the first lens structure on a plane where the encapsulation layer is located is within a projection of the pixel definition structure on the plane where the encapsulation layer is located. A refractive index of the first lens structure is smaller than a refractive index of the planarization layer.

In an exemplary implementation, the pixel unit includes a cathode layer, an electron transport layer, a light emitting layer, a hole transport layer, and an anode layer; or the pixel unit includes a backlight layer, an array substrate and a liquid crystal encapsulation layer.

In an exemplary implementation, the first lens structure includes a first surface away from the light emitting device layer, a second surface close to the light emitting device layer, and a third surface connecting the first surface and the second surface. A projection of the first surface on the plane where the encapsulation layer is located is within a projection of the second surface on the plane where the encapsulation layer is located. The undulating morphology is formed on the first surface.

In an exemplary implementation, the third surface is a smooth surface.

In an exemplary implementation, the undulating morphology includes protrusions and depressions which are alternately distributed. A projection of the protrusions on the plane where the encapsulation layer is located and a projection of the depressions on the plane where the encapsulation layer is located both surround a projection of the pixel unit on the plane where the encapsulation layer is located.

In an exemplary implementation, the undulating morphology includes at least one of the following features: at least one of the projection of the protrusions on the plane where the encapsulation layer is located and the projection of the depressions on the plane where the encapsulation layer is located includes a ring-shaped projection; and at least one of the projection of the protrusions on the plane where the encapsulation layer is located and the projection of the depressions on the plane where the encapsulation layer is located includes at least two segment-shaped projections with end-to-end spacing.

In an exemplary implementation, the projection of the protrusions in the plane where the encapsulation layer is located and the projection of the depressions in the plane where the encapsulation layer is located are all located on different ring-shaped projection profiles which are coaxial but have different sizes, and are distributed alternately on different ring-shaped projection profiles; or the projection of the protrusions in the plane where the encapsulation layer is located and the projection of the depressions in the plane where the encapsulation layer is located are all located on the same ring-shaped projection profile and alternately distributed on the ring-shaped projection profile.

In an exemplary implementation, the optical adjustment layer further includes a second lens structure. The second lens structure is located between the encapsulation layer and a portion of the planarization layer. A projection of the second lens structure on the plane where the encapsulation layer is located is within the projection of the pixel unit on the plane where the encapsulation layer is located. A refractive index of the second lens structure is greater than the refractive index of the planarization layer.

In an exemplary implementation, the second lens structure includes a fourth surface away from the light emitting device layer, a fifth surface close to the light emitting device layer, and a sixth surface connecting the fourth surface and the fifth surface. A projection of the fifth surface on the plane where the encapsulation layer is located is within a projection of the fourth surface on the plane where the encapsulation layer is located.

In an exemplary implementation, the sixth surface is a smooth surface; and/or the fourth surface and the fifth surface are smooth surfaces.

In an exemplary implementation, the second lens structure and the first lens structure are separated by a portion of the planarization layer.

In an exemplary implementation, the light emitting device layer includes a pixel definition structure, and a pixel unit enclosed by the pixel definition structure. A projection of the first lens structure on the plane where the encapsulation layer is located is within a projection of the pixel definition structure on the plane where the encapsulation layer is located. The optical adjustment layer further includes a second lens structure located between the encapsulation layer and a portion of the planarization layer. A projection of the second lens structure on the plane where the encapsulation layer is located is within a projection of the pixel unit on the plane where the encapsulation layer is located. A refractive index of the first lens structure and a refractive index of the second lens structure are both greater than a refractive index of the planarization layer.

An exemplary embodiment of the present disclosure also provides a display apparatus, including the display panel described in any of above embodiments.

An exemplary embodiment of the present disclosure further provides a manufacturing method for a display panel, including: preparing a light emitting device layer and forming an encapsulation layer on a side of the light emitting device layer; preparing a first lens structure on the encapsulation layer and making at least a portion of a surface of the first lens structure away from the light emitting device layer have an undulating morphology; and forming a planarization layer on the first lens structure and on an exposed encapsulation layer.

In an exemplary implementation, preparing a first lens structure on the encapsulation layer and making at least a portion of a surface of the first lens structure away from the light emitting device layer have an undulating morphology includes; preparing a first lens structure on the encapsulation layer; and exposing at least a portion of the surface of the first lens structure away from the light emitting device layer using a half tone mask to form the undulating morphology.

In an exemplary implementation, preparing a first lens structure on the encapsulation layer and making at least a portion of a surface of the first lens structure away from the light emitting device layer have an undulating morphology includes; forming a first light transmitting layer on the encapsulation layer; performing plasma gas bombardment on at least a portion of a surface of the first light transmitting layer using a mask to form the undulating morphology on the at least a portion of the surface; and patterning the first light transmitting layer to obtain the first lens structure.

In an exemplary implementation, preparing a first lens structure on the encapsulation layer and making at least a portion of a surface of the first lens structure away from the light emitting device layer have an undulating morphology includes; preparing a first lens structure on the encapsulation layer, wherein the first lens structure includes a first surface away from the light emitting device layer, a second surface close to the light emitting device layer, and a third surface connecting the first surface and the second surface, and a projection of the first surface on a plane where the encapsulation layer is located is within a projection of the second surface on the plane where the encapsulation layer is located; preparing a photoresist structure on the third surface of the first lens structure; and wet-etching the first surface of the first lens structure with the photoresist structure as a mask to form the undulating morphology on the first surface.

In an exemplary implementation, prior to forming a planarization layer on the first lens structure and on an exposed encapsulation layer, the method further includes: preparing a sacrificial structure on the exposed encapsulation layer, wherein a projection of the sacrificial structure on a plane where the encapsulation layer is located is within a projection of a pixel definition structure of the light emitting device layer on the plane where the encapsulation layer is located, the sacrificial structure includes a seventh surface away from the light emitting device layer, an eighth surface close to the light emitting device layer, and a ninth surface connecting the seventh surface and the eighth surface, and a projection of the seventh surface on the plane where the encapsulation layer is located is within a projection of the eighth surface on the plane where the encapsulation layer is located; coating a second light transmitting material between adjacent sacrificial structures, wherein a refractive index of the second light transmitting material is greater than a refractive index of the planarization layer; and removing the sacrificial structure to obtain a second lens structure.

An exemplary embodiment of the present disclosure provides a manufacturing method for a display panel, including: preparing a light emitting device layer and forming an encapsulation layer on a side of the light emitting device layer; preparing a first lens structure on the encapsulation layer and making at least a portion of a surface of the first lens structure away from the light emitting device layer have an undulating morphology; preparing a sacrificial structure on an exposed encapsulation layer; coating a second light transmitting material between adjacent sacrificial structures; removing the sacrificial structure to obtain a second lens structure; and forming a planarization layer on the first lens structure, the second lens structure, and the exposed encapsulation layer.

Additional aspects and advantages of the present disclosure will be set forth in part in the following description, and will be apparent from the following description, or may be learned through practice of the present disclosure.

DETAILED DESCRIPTION

Embodiments of the present disclosure are described below in conjunction with the drawings in the present disclosure. Implementations described below in conjunction with the drawings are exemplary descriptions for explaining the technical schemes of the embodiments of the present disclosure and are not limiting to the technical schemes of the embodiments of the present disclosure.

The embodiments and features in the embodiments of the present disclosure may be randomly combined with each other if there is no conflict.

It can be understood by those skilled in the art that unless otherwise specified, the singular forms “a”, “an”, “said”, and “the” used herein may also include plural forms. The term “including” used in the specification of the present disclosure refers to the presence of the stated features, integers, steps, operations, elements and/or assemblies, but does not exclude the implementation of other features, information, data, steps, operations, elements, assemblies and/or combinations thereof or the like supported by the art. The term “and/or” used herein refers to at least one of the items defined by the term, e.g., “A and/or B” may be implemented as “A”, or as “B”, or as “A and B”.

Implementations of the present disclosure will be further described in detail below with reference to the drawings.

Firstly, several terms related to the present disclosure are introduced and explained:

EES: External (located outside a light emitting device layer) Extraction Structure.

After the reliability test (high temperature and high humidity) of the existing display apparatus samples with optical adjustment layer, the film structures with different refractive indexes in the optical adjustment layer are easy to fall off, which leads to undesirable phenomena such as bubbles or cracks in the display apparatus, and the reliability of the product is insufficient, which seriously affects the service life and display effect of the product.

Technical schemes of the present disclosure will be described below in detail with exemplary embodiments. The following implementations may be cross-referenced, learned or combined, and the same terms, similar features, similar implementation steps and the like in different implementations are not described repeatedly.

Figure 1:
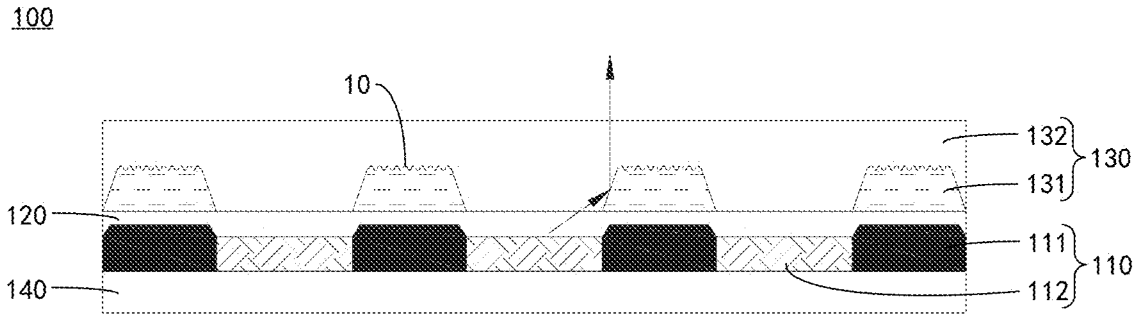
FIG. 1 is a schematic diagram of a cross-sectional structure of a display panel provided by an exemplary embodiment of the present disclosure.

An exemplary embodiment of the present disclosure provides a display panel 100, and a schematic structural diagram of the display panel 100 is as shown in FIG. 1. The display panel 100 includes a light emitting device layer 110, an encapsulation layer 120, and an optical adjustment layer 130 which are sequentially stacked.

The optical adjustment layer 130 includes a first lens structure 131 located on a side of the encapsulation layer 120 away from the light emitting device layer 110, and a planarization layer 132 located on a side of the first lens structure 131 away from the light emitting device layer 110 and on a side of the exposed encapsulation layer 120 away from the light emitting device layer 110.

A surface of at least a portion of the first lens structure 131 away from the light emitting device layer 110 has an undulating morphology 10.

In the present exemplary embodiment, the optical adjustment layer 130 of the display panel 100 adopts a light adjustment structure including the first lens structure 131 and the planarization layer 132. A refractive index of the first lens structure 131 is different from a refractive index of the planarization layer 132. By correcting light by using a critical surface between the first lens structure 131 and the planarization layer 132, it is possible to adjust an incident angle of light on a critical surface between an inner and outer optical path regions of the display apparatus, reduce the probability or degree of total internal reflection, and improve the light emitting efficiency of the display apparatus.

In the optical adjustment layer 130 of the display panel 100, at least a portion of the surface of the first lens structure 131 away from the light emitting device layer 110 has an undulating morphology 10. That is, by improving the roughness of a contact surface between the first lens structure 131 and the planarization layer 132, the adhesion between the first lens structure 131 and the planarization layer 132 can be improved, and the probability of possible falling off between the first lens structure 131 and the planarization layer 132 can be reduced, thereby reducing undesirable phenomena such as bubbles or cracks, improving display effect, improving product reliability and prolonging product life.

In the display panel 100, the optical adjustment layer 130 is located on a side of the encapsulation layer 120 away from the light emitting device layer 110. That is, an EES structure is adopted, which is beneficial to ensuring the encapsulation effect of the encapsulation layer 120 on the light emitting device layer 110 and improving the stability and durability of the product.

Figure 2:
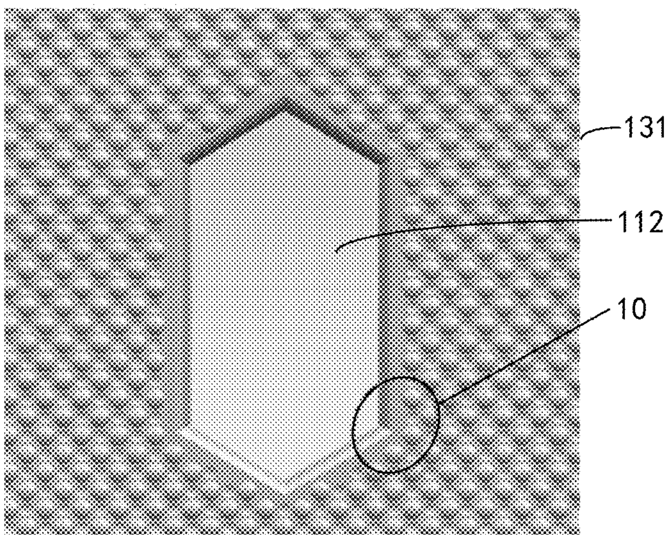
FIG. 2 is a schematic diagram of a top view structure of one pixel unit and a portion of a first lens structure in FIG. 1.

In some possible exemplary implementations, as shown in FIG. 2, the light emitting device layer 110 includes a pixel definition structure 111 and a pixel unit 112 enclosed by the pixel definition structure 111.

A projection of the first lens structure 131 on a plane where the encapsulation layer 120 is located is within a projection of the pixel definition structure 111 on the plane where the encapsulation layer 120 is located.

The refractive index of the first lens structure 131 is smaller than the refractive index of the planarization layer 132.

In the present exemplary embodiment, the projection of the first lens structure 131 on the plane where the encapsulation layer 120 is located is within the projection of the pixel definition structure 111 on the plane where the encapsulation layer 120 is located, and the refractive index of the first lens structure 131 is smaller than the refractive index of the planarization layer 132, which facilitates the formation of an optical path of "the light emitting device layer 110→the planarization layer 132→the first lens structure 131→the planarization layer 132→the outside of the display panel 100" by a portion of the light emitted from the light emitting device layer 110. An optical path portion of "the planarization layer 132→the first lens structure 131→the planarization layer 132" may form total reflection.

That is, the first lens structure 131 having a relatively low refractive index is positioned around a light emitting region, and a portion of the planarization layer 132 having a relatively high refractive index is filled in the light emitting region. The incident angle of the light emitted from the light emitting device layer 110 on the critical surface between the inner and outer optical path regions of the display apparatus can be adjusted or restricted by using the principle of total reflection, thereby reducing the total internal reflection of the light in a squint direction, reducing the probability or degree of total internal reflection, and improving the light emitting efficiency of the display apparatus.

In an exemplary implementation, the pixel unit 112 may include a cathode layer, an electron transport layer, a light emitting layer, a hole transport layer, an anode layer, and the like to constitute a display structure such as an LED (Light Emitting Diode) or a Micro-LED (Micro Light Emitting Diode) or an OLED (Organic Light-Emitting Diode).

In an exemplary implementation, the pixel unit 112 may include a backlight layer, an array substrate, a liquid crystal encapsulation layer, and the like to constitute an LCD (Liquid Crystal Display) display structure.

In some possible exemplary implementations, the first lens structure 131 includes a first surface away from the light emitting device layer 110, a second surface close to the light emitting device layer 110, and a third surface connecting the first surface and the second surface.

A projection of the first surface on the plane where the encapsulation layer 120 is located is within a projection of the second surface on the plane where the encapsulation layer 120 is located.

The undulating morphology 10 is formed on the first surface.

In the present exemplary embodiment, the projection of the first surface of the first lens structure 131 on the plane where the encapsulation layer 120 is located is within the projection of the second surface of the first lens structure 131 on the plane where the encapsulation layer 120 is located. That is, a trapezoidal cross section with its upper surface away from the light emitting device layer 110 and its lower surface close to the light emitting device layer 110 can be formed, which is beneficial to reduce an included angle between a large-angle light emitted from the light emitting device layer 110 and a small-angle light (main light path) after total reflection at the third surface (the critical surface between the planarization layer 132 and the first lens structure 131). That is, the large-angle light is corrected to the small-angle light by using the third surface of the first lens structure 131 to improve the light emitting efficiency.

Since the first lens structure 131 is positioned around the light emitting region, the first surface of the first lens structure 131 is less involved in light adjustment. Thus the undulating morphology 10 is formed on the first surface, so that the adhesion between the first lens structure 131 and the planarization layer 132 can be ensured to be improved, and a disorder influence on the optical path can be reduced.

Based on the previous exemplary embodiment, in some possible exemplary implementations, the third surface is a smooth surface. This is beneficial to improve the optical path adjustment accuracy of the optical adjustment layer 130.

In an exemplary implementation, the third surface may be a smooth plane, or may be a smooth curved surface. Alternatively, the third surface may be other relatively regular surfaces.

In some possible exemplary embodiments, as shown in FIGS. 3 to 6, the undulating morphology 10 includes protrusions 11 and depressions 12 which are alternately distributed.

A projection of the protrusions 11 on the plane where the encapsulation layer 120 is located and a projection of the depressions 12 on the plane where the encapsulation layer 120 is located both surround a projection of the pixel unit 112 on the plane where the encapsulation layer 120 is located.

In the present exemplary embodiment, the protrusions 11 and the depressions 12 surround the light emitting region of the light emitting device layer 110 and are alternately distributed, so as to form a pattern approximate to the profile of the pixel, and facilitate the reduction of possible disorder effects on the optical path.

Based on the previous exemplary embodiment, in some possible exemplary implementations, the undulating morphology 10 includes the following possible characteristics.

Figure 3:
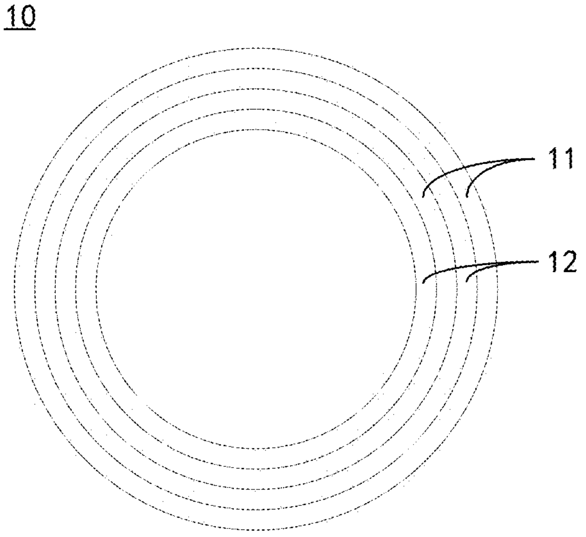
FIG. 3 is a schematic diagram of a top view structure of an implementation of an undulating morphology provided by an exemplary embodiment of the present disclosure.

In one example, as shown in FIG. 3, at least one of the projection of the protrusions 11 on the plane where the encapsulation layer 120 is located and the projection of the depressions 12 on the plane where the encapsulation layer 120 is located includes a ring-shaped projection.

Alternatively, the ring shape may be a circular ring, or may be a polygonal ring such as a triangular ring, a rectangular ring, or may be other special-shaped rings.

Figure 5:
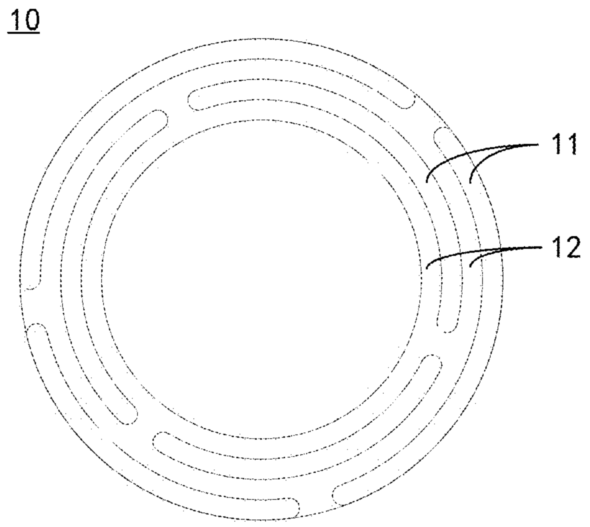
FIG. 5 is a schematic diagram of a top view structure of yet another implementation of an undulating morphology provided by an exemplary embodiment of the present disclosure.
Figure 6:
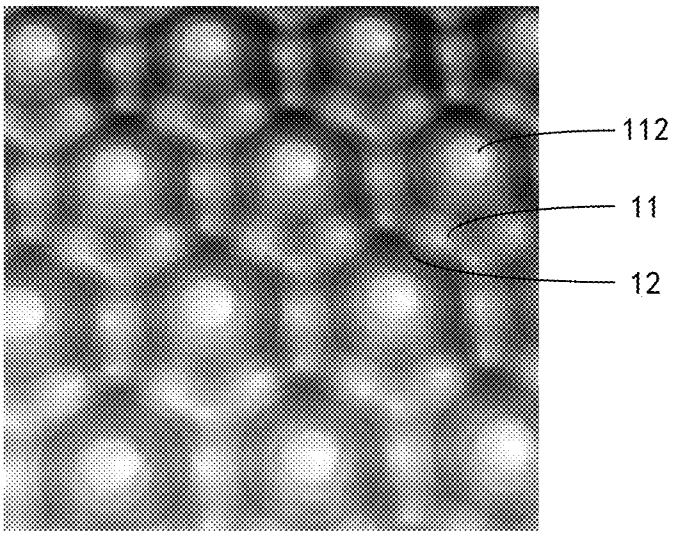
FIG. 6 is a micro-morphology diagram of an undulating morphology provided by an exemplary embodiment of the present disclosure.

In another example, as shown in FIG. 5, at least one of the projection of the protrusions 11 on the plane where the encapsulation layer 120 is located and the projection of the depressions 12 on the plane where the encapsulation layer 120 is located includes at least two segment projections with end-to-end spacing.

Figure 4:
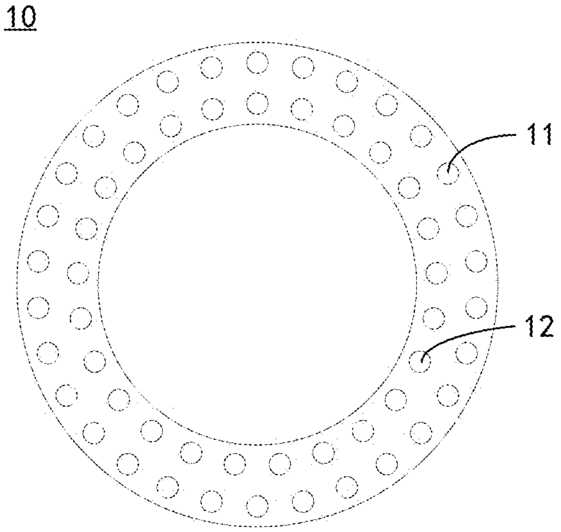
FIG. 4 is a schematic diagram of a top view structure of another implementation of an undulating morphology provided by an exemplary embodiment of the present disclosure.

Alternatively, as shown in FIG. 4, the projection of the protrusions 11 on the plane where the encapsulation layer 120 is located and the projection of the depressions 12 on the plane where the encapsulation layer 120 is located may both be located on different ring-shaped projection profiles which are coaxial but have different sizes (e.g. different inner diameters), and are alternately distributed on different ring-shaped projection profiles.

Alternatively, the projection of the protrusions 11 on the plane where the encapsulation layer 120 is located and the projection of the depressions 12 on the plane where the encapsulation layer 120 is located may both be located on the same ring-shaped projection profile and alternately distributed on the ring-shaped projection profile.

In yet another example, the projection of the protrusions 11 on the plane where the encapsulation layer 120 is located includes a ring-shaped projection, and the projection of the depressions 12 on the plane where the encapsulation layer 120 is located includes at least two segment projections with end-to-end spacing. Alternatively, the projection of the protrusions 11 on the plane where the encapsulation layer 120 is located includes at least two segment projections with end-to-end spacing, and the projection of the depressions 12 on the plane where the encapsulation layer 120 is located includes a ring-shaped projection.

Figure 7:
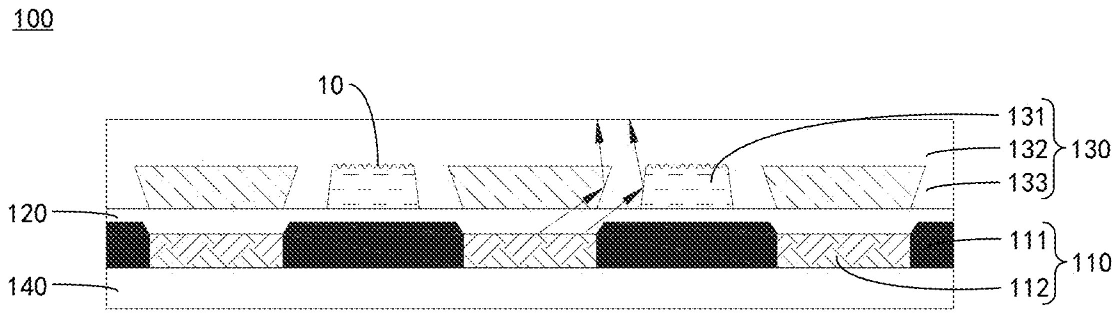
FIG. 7 is a schematic diagram of a cross-sectional structure of another display panel provided by an exemplary embodiment of the present disclosure.
Figure 8:
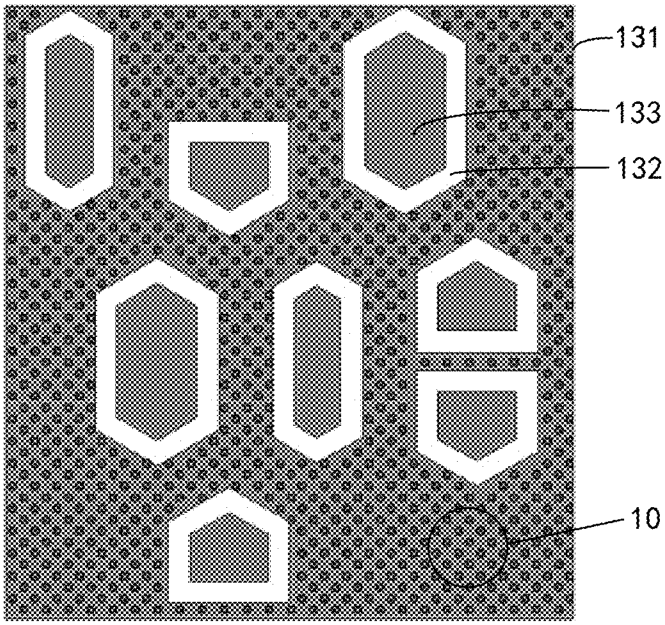
FIG. 8 is a schematic diagram of a top view structure of the structure in FIG. 7.

In some possible exemplary implementation, as shown in FIGS. 7 and 8, the optical adjustment layer 130 further includes a second lens structure 133.

The second lens structure 133 is located between the encapsulation layer 120 and a portion of the planarization layer 132.

A projection of the second lens structure 133 on the plane where the encapsulation layer 120 is located is within the projection of the pixel unit 112 on the plane where the encapsulation layer 120 is located.

A refractive index of the second lens structure 133 is greater than that of the planarization layer 132.

In the present exemplary embodiment, the second lens structure 133 having a refractive index higher than that of the planarization layer 132 is disposed in the light emitting region, so that a critical surface between the second lens structure 133 and the planarization layer 132 can also adjust the large-angle light emitted from the light emitting device layer 110. The angle of a portion of the large-angle light entering the planarization layer 132 from the second lens structure 133 is reduced, that is, the included angle between the large-angle light and the small-angle light (main light path) is reduced, thereby improving the light emitting efficiency.

In some possible exemplary implementations, the second lens structure 133 includes a fourth surface away from the light emitting device layer 110, a fifth surface close to the light emitting device layer 110, and a sixth surface connecting the fourth surface and the fifth surface.

A projection of the fifth surface on the plane where the encapsulation layer 120 is located is within a projection of the fourth surface on the plane where the encapsulation layer 120 is located.

In the present exemplary embodiment, the projection of the fifth surface of the second lens structure 133 on the plane where the encapsulation layer 120 is located is within the projection of the fourth surface on the plane where the encapsulation layer 120 is located. That is, a trapezoidal cross section with its upper surface close to the light emitting device layer 110 and its lower surface away from the light emitting device layer 110 can be formed, which is beneficial to reduce the probability that the sixth surface of the second lens structure 133 (the critical surface between the second lens structure 133 and the planarization layer 132) causes excessive adjustment of the light emitted from the light emitting device layer 110, allows some light at reasonable angle to pass normally, and can also improve the light emitting efficiency.

In an exemplary implementation, the sixth surface of the second lens structure 133 is a smooth surface, which facilitates improving the optical path adjustment accuracy of the optical adjustment layer 130.

In an exemplary implementation, the fourth surface and the fifth surface of the second lens structure 133 are also smooth surfaces, which facilitate reducing the probability of disordered refraction of light and improving light emitting efficiency.

In some possible exemplary implementations, the second lens structure 133 and the first lens structure 131 are separated by a portion of the planarization layer 132.

In the present exemplary embodiment, the second lens structure 133 and the first lens structure 131 are separated by a portion of the planarization layer 132. On the one hand, two levels of total reflection critical surfaces can be formed between the second lens structure 133 and the first lens structure 131 (one level of total reflection critical surface is formed between the second lens structure 133 and the planarization layer 132, and the other level of total reflection critical surface is formed between the planarization layer 132 and the first lens structure 131). These total reflection critical surfaces can cooperate to correct light and improve light emitting efficiency. On the other hand, the contact area of the whole of the second lens structure 133 and the first lens structure 131 with the planarization layer 132 can be increased, so that the adhesion between the whole of the first lens structure 131 and the second lens structure 133 and the planarization layer 132 in the optical adjustment layer 130 can be improved, and the probability that the film structure in the optical adjustment layer 130 may fall off can be reduced, thereby reducing undesirable phenomena such as bubbles or cracks, improving display effect, improving product reliability and prolonging product life.

In some possible exemplary implementations, the light emitting device layer 110 includes a pixel definition structure 111 and a pixel unit 112 enclosed by the pixel definition structure 111.

A projection of the first lens structure 131 on the plane where the encapsulation layer 120 is located is within a projection of the pixel definition structure 111 on the plane where the encapsulation layer 120.

The optical adjustment layer 130 further includes a second lens structure 133 located between the encapsulation layer 120 and a portion of the planarization layer 132. The projection of the second lens structure 133 on the plane where the encapsulation layer 120 is located is within the projection of the pixel unit 112 on the plane where the encapsulation layer 120 is located.

The refractive index of the first lens structure 131 and the refractive index of the second lens structure 133 are both greater than the refractive index of the planarization layer 132.

In the present exemplary embodiment, the refractive index of the second lens structure 133 is higher than the refractive index of the planarization layer 132, and the second lens structure 133 is disposed in the light emitting region, so that the critical surface between the second lens structure 133 and the planarization layer 132 can adjust the large-angle light emitted from the light emitting device layer 110. The angle of a portion of the large-angle light entering the planarization layer 132 from the second lens structure 133 is reduced, that is, the included angle between the large-angle light and the small-angle light (main light path) is reduced, and the light emitting efficiency is improved.

In addition, the refractive index of the first lens structure 131 is also higher than that of the planarization layer 132. On the one hand, it is beneficial to correct the angle of a portion of the large-angle light entering the first lens structure 131 when passing through the critical surface between the first lens structure 131 and the planarization layer 132, that is, to reduce the included angle between the large-angle light and the small-angle light (main light path) and improve the light emitting efficiency. On the other hand, it is beneficial for the first lens structure 131 and the second lens structure 133 to be made of the same material, thereby facilitating the first lens structure 131 and the second lens structure 133 to share the manufacturing process, simplifying the process, shortening the process cycle and reducing the manufacturing cost.

An exemplary embodiment of the present disclosure provides a display apparatus including any display panel 100 as provided by the above exemplary embodiments.

In the present exemplary embodiment, since the display apparatus includes any of the display panels 100 provided by the foregoing exemplary embodiments, the implementation principle and beneficial effects thereof are similar and will not be repeated here.

In an exemplary implementation, the display apparatus may include a mobile phone, a tablet computer, a mobile terminal, an e-book, an electronic photo frame, and the like.

Figure 9:
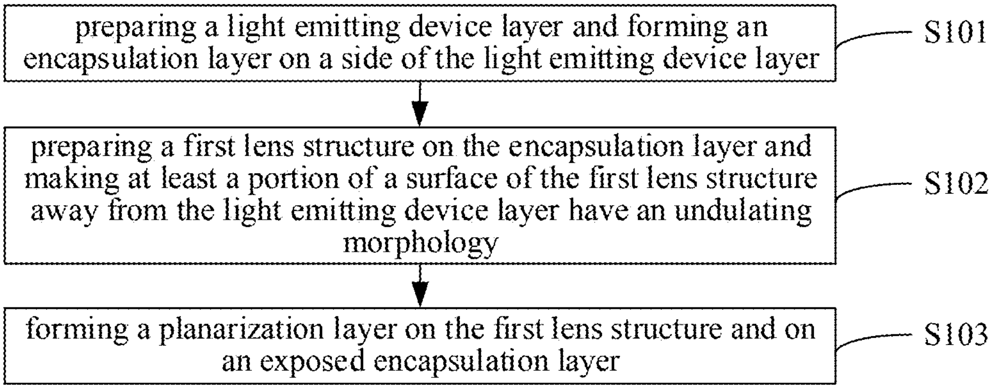
FIG. 9 is a schematic flowchart of a manufacturing method for a display panel provided by an exemplary embodiment of the present disclosure.

An exemplary embodiment of the present disclosure provides a manufacturing method for a display panel, the schematic flowchart of which is shown in FIG. 9, including the following steps S101 to S103:

S101: preparing a light emitting device layer and forming an encapsulation layer on a side of the light emitting device layer;

S102: preparing a first lens structure on the encapsulation layer and making at least a portion of a surface of the first lens structure away from the light emitting device layer have an undulating morphology;

S103: forming a planarization layer on the first lens structure and on the exposed encapsulation layer.

In the present exemplary embodiment, in the display panel 100 prepared through steps S101 to S103, the optical adjustment layer 130 adopts a light adjustment structure including the first lens structure 131 and the planarization layer 132. A refractive index of the first lens structure 131 is different from a refractive index of the planarization layer 132. By correcting light by using a critical surface between the first lens structure 131 and the planarization layer 132, it is possible to adjust the incident angle of light on the critical surface between the inner and outer optical path regions of the display apparatus, reduce the probability or degree of total internal reflection, and improve the light emitting efficiency of the display apparatus.

In the optical adjustment layer 130 of the display panel 100, at least a portion of the surface of the first lens structure 131 away from the light emitting device layer 110 has an undulating morphology 10. That is, by improving the roughness of a contact surface between the first lens structure 131 and the planarization layer 132, the adhesion between the first lens structure 131 and the planarization layer 132 is improved and the probability of possible falling off between the first lens structure 131 and the planarization layer 132 is reduced, thereby reducing undesirable phenomena such as bubbles or cracks, improving display effect, improving product reliability and prolonging product life.

In the display panel 100, the optical adjustment layer 130 is located on a side of the encapsulation layer 120 away from the light emitting device layer 110. That is, an EES structure is adopted, which is beneficial to ensuring the encapsulation effect of the encapsulation layer 120 on the light emitting device layer 110 and improving the stability and durability of the product.

Figure 10:
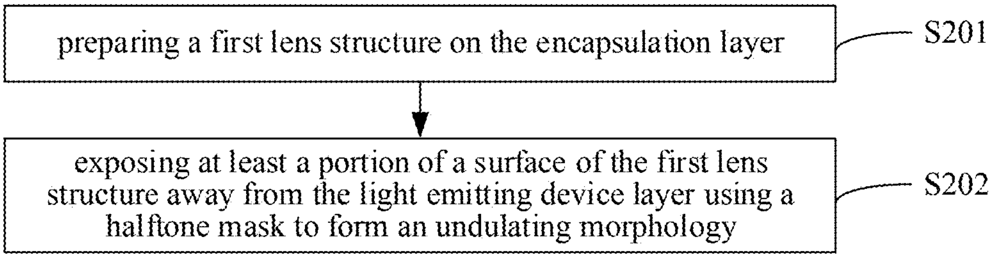
FIG. 10 is a schematic flowchart of an implementation in which a first lens structure is prepared on a encapsulation layer and at least a portion of a surface of the first lens structure away from a light emitting device layer has an undulating morphology in a manufacturing method for a display panel provided by an exemplary embodiment of the present disclosure.

In some possible exemplary implementations, as shown in FIG. 10, the above step S102 of preparing a first lens structure on the encapsulation layer and making at least a portion of a surface of the first lens structure away from the light emitting device layer have an undulating morphology includes the following steps S201 to S202.

S201: preparing the first lens structure on the encapsulation layer.

In an exemplary implementation, in the step S201, a light transmitting organic material may be coated on the encapsulation layer 120 to form a light transmitting organic layer, and then the light transmitting organic layer is patterned to obtain the first lens structure 131.

In an exemplary implementation, a refractive index of the light transmitting organic material is less than the refractive index of the planarization layer 132 prepared in subsequent steps.

In an exemplary implementation, when patterning the light transmitting organic layer, a portion of the light transmitting organic layer corresponding to the light emitting region of the light emitting device layer 110 may be removed, and a portion of the light transmitting organic layer corresponding to the periphery of the light emitting region of the light emitting device layer 110 may be retained. That is, the projection of the first lens structure 131 obtained by patterning the light transmitting organic layer on the plane where the encapsulation layer 120 is located is within the projection of the pixel definition structure 111 on the plane where the encapsulation layer 120 is located.

S202: exposing at least a portion of the surface of the first lens structure away from the light emitting device layer using a half tone mask to form the undulating morphology.

Steps S201 to S202 provided in the present exemplary embodiment employ a half tone mask technique to realize the formation of the undulating morphology 10 on the surface of the first lens structure 131 away from the light emitting device layer 110 in the same mask exposure process.

The half tone mask technique reduces the amount of exposure received by the exposed object by reducing the transmittance of a portion of the opening part in the mask, so that the exposure extent of the region corresponding to the opening part with reduced transmittance is different from the exposure extent of the region corresponding to the opening part without reduced transmittance after the exposed object exposed by the same mask is developed, thus forming the undulating morphology 10.

The transmittance of the portion of the opening part of the mask can be reduced by plating a thin layer of metal Cr (chromium) on the portion of the opening part of the mask.

Figure 11:
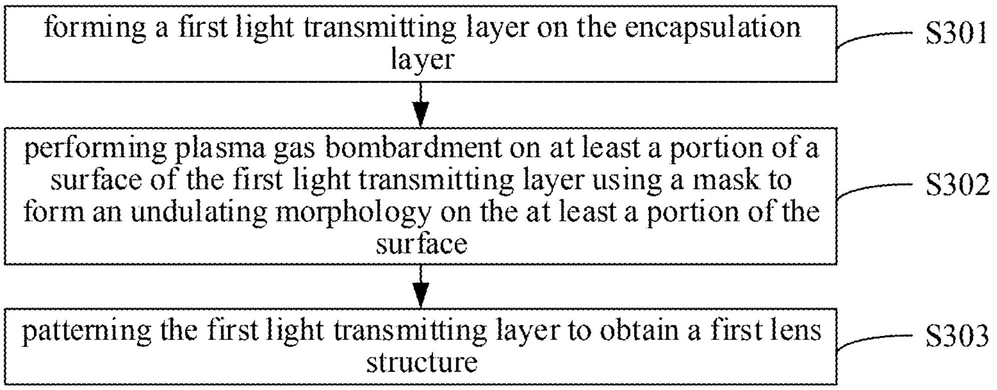
FIG. 11 is a schematic flowchart of another implementation in which a first lens structure is prepared on a encapsulation layer and at least a portion of a surface of the first lens structure away from a light emitting device layer has an undulating morphology in a manufacturing method for a display panel provided by an exemplary embodiment of the present disclosure.

In some other possible exemplary implementations, as shown in FIG. 11, the above step S102 of preparing a first lens structure on the encapsulation layer and making at least a portion of a surface of the first lens structure away from the light emitting device layer have an undulating morphology includes the following steps S301 to S303.

S301: forming a first light transmitting layer on the encapsulation layer.

In an exemplary implementation, in the step S301, the encapsulation layer 120 may be coated with a light transmitting organic material to form a first light transmitting layer.

In an exemplary implementation, the refractive index of the light transmitting organic material is less than the refractive index of the planarization layer 132 prepared in subsequent steps.

S302: performing plasma gas bombardment on at least a portion of the surface of the first light transmitting layer using a mask to form the undulating morphology on the at least a portion of the surface.

In this step S302, plasma gas bombardment is adopted and process conditions are controlled, so that the surface of the first light transmitting layer can form an undulating morphology.

S303: patterning the first light transmitting layer to obtain a first lens structure.

In an exemplary implementation, when patterning the first light transmitting layer, a portion of the first light transmitting layer corresponding to the light emitting region of the light emitting device layer 110 may be removed, and a portion of the first light transmitting layer corresponding to the periphery of the light emitting region of the light emitting device layer 110 may be retained. That is, the projection of the first lens structure 131 obtained by patterning the first light transmitting layer on the plane where the encapsulation layer 120 is located is within the projection of the pixel definition structure 111 on the plane where the encapsulation layer 120 is located.

Steps S301 to S303 provided in the present exemplary embodiment employ a patterning process of first forming an undulating morphology 10 on at least a portion of the surface of the first light transmitting layer and then performing a plasma gas bombardment on the first light transmitting layer to obtain a first lens structure 131 having the undulating morphology 10 on the surface away from the light emitting device layer 110.

Figure 12:
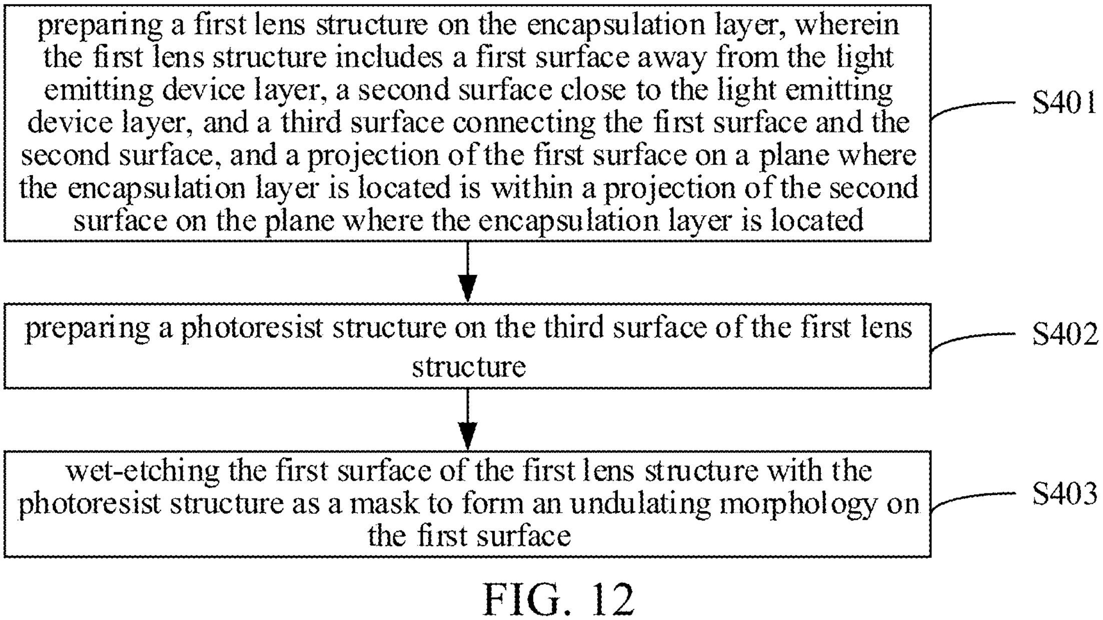
FIG. 12 is a schematic flowchart of yet another implementation in which a first lens structure is prepared on a encapsulation layer and at least a portion of a surface of the first lens structure away from a light emitting device layer has an undulating morphology in a manufacturing method for a display panel provided by an exemplary embodiment of the present disclosure.

In some yet other possible exemplary implementations, as shown in FIG. 12, the above step S102 of preparing a first lens structure on the encapsulation layer and making at least a portion of a surface of the first lens structure away from the light emitting device layer have an undulating morphology includes the following steps S401 to S403.

S401: preparing a first lens structure on the encapsulation layer. The first lens structure includes a first surface away from the light emitting device layer, a second surface close to the light emitting device layer, and a third surface connecting the first surface and the second surface. A projection of the first surface on the plane where the encapsulation layer is located is within a projection of the second surface on the plane where the encapsulation layer is located.

The first lens structure 131 obtained by this step S401 can form a trapezoidal cross section with its upper surface away from the light emitting device layer 110 and a lower surface close to the light emitting device layer 110.

In an exemplary implementation, in the step S401, a light transmitting organic material may be coated on the encapsulation layer 120 to form a light transmitting organic layer, and then the light transmitting organic layer is patterned to obtain the first lens structure 131. In the process of patterning the light transmitting organic layer, a half tone mask technique can also be used to control the extent of patterning for the region of the light transmitting organic layer corresponding to the third surface of the first lens structure 131 to be obtained later, so as to form a ramp-shaped third surface.

S402: preparing a photoresist structure on the third surface of the first lens structure.

The photoresist structure obtained in step S401 can protect the third surface of the first lens structure 131 in a subsequent wet-etching process, so that the third surface of the first lens structure 131 retains smoothness.

In an exemplary implementation, in the step S402, a photoresist material may be coated on the first surface and the third surface of the first lens structure 131 and the exposed encapsulation layer 120 to form a photoresist layer, and then the photoresist layer is patterned to expose the first surface of the first lens structure 131 and retain a portion of the photoresist layer attached to the third surface of the first lens structure 131. That is, a photoresist structure on the third surface of the first lens structure 131 is prepared.

S403: wet-etching the first surface of the first lens structure with the photoresist structure as a mask to form an undulating morphology on the first surface.

Steps S401 to S403 provided in the present exemplary embodiment employ a wet-etching process to realize the formation of the undulating morphology 10 on the surface of the first lens structure 131 away from the light emitting device layer 110.

Figure 13:
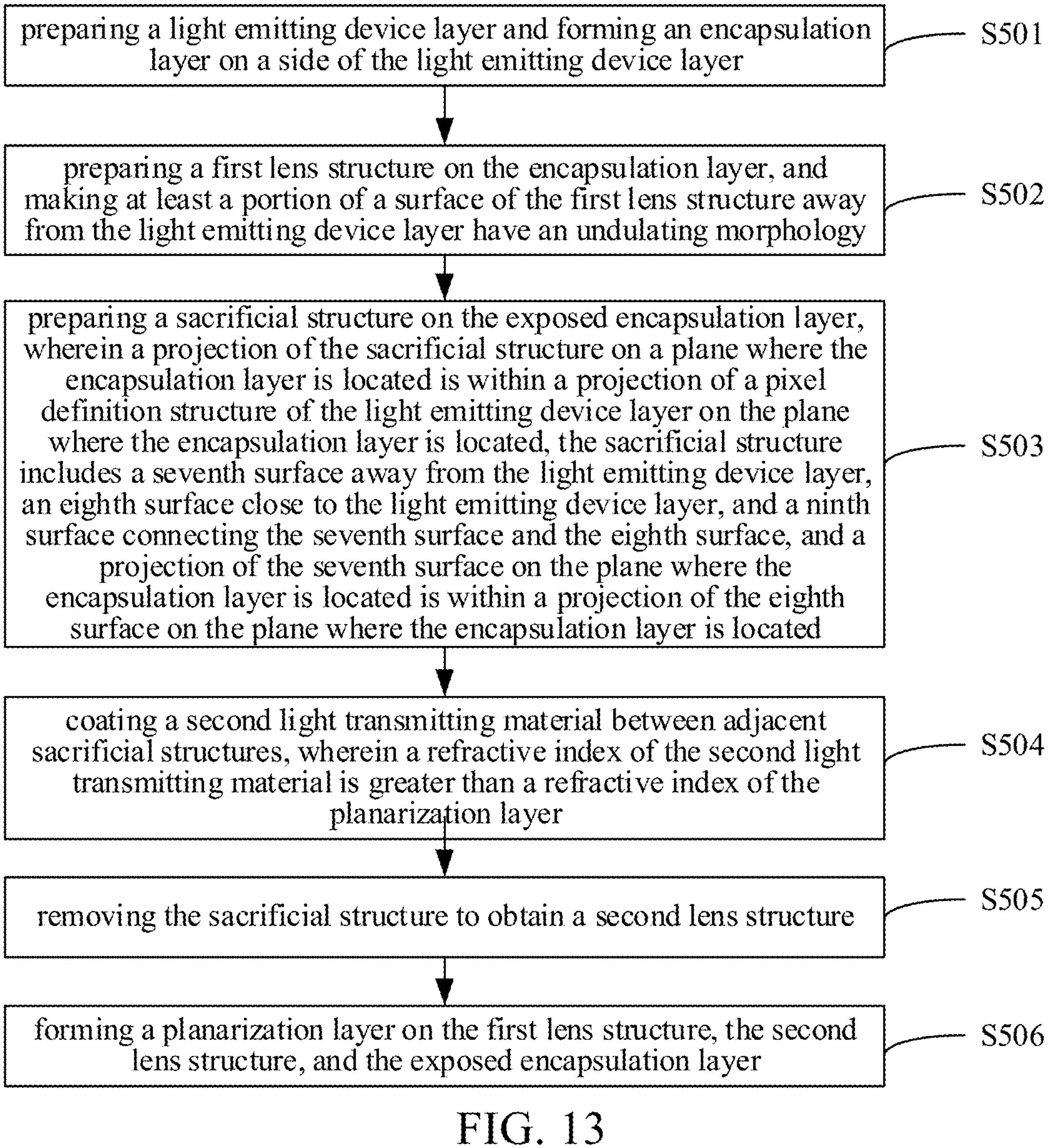
FIG. 13 is a schematic flowchart of another manufacturing method for a display panel provided by an exemplary embodiment of the present disclosure.

An exemplary embodiment of the present disclosure provides another manufacturing method for a display panel, the schematic flowchart of which is shown in FIG. 13, including the following steps S501 to S506.

S501: preparing a light emitting device layer and forming an encapsulation layer on a side of the light emitting device layer.

In an exemplary implementation, the light emitting device layer 110 prepared by this step S501 includes a pixel definition structure 111, and a pixel unit 112 enclosed by the pixel definition structure 111. The encapsulation layer 120 can provide water-oxygen protection to the light emitting device layer 110 and improve the stability and durability of the display panel 100.

S502: preparing a first lens structure on the encapsulation layer and making at least a portion of a surface of the first lens structure away from the light emitting device layer have an undulating morphology.

S503: preparing a sacrificial structure on the exposed encapsulation layer. A projection of the sacrificial structure on the plane where the encapsulation layer is located is within a projection of the pixel definition layer of the light emitting device layer on the plane where the encapsulation layer is located. The sacrificial structure includes a seventh surface away from the light emitting device layer, an eighth surface close to the light emitting device layer, and a ninth surface connecting the seventh surface and the eighth surface. A projection of the seventh surface on the plane where the encapsulation layer is located is within a projection of the eighth surface on the plane where the encapsulation layer is located.

The sacrificial structure prepared in step S503 matches a shape of a second lens structure 133 to be prepared later. Both the sacrificial structure and the first lens structure 131 are located around the light emitting region corresponding to the light emitting device layer 110, so that the light emitting region corresponding to the light emitting device layer 110 can be exposed, thus facilitating subsequent preparation of the second lens structure 133 in the light emitting region corresponding to the light emitting device layer 110.

S504: coating a second light transmitting material between adjacent sacrificial structures. A refractive index of the second light transmitting material is greater than the refractive index of the planarization layer.

A portion of the second light transmitting material coated in step S504 can be supported by a ninth surface of the sacrificial structure prepared in the previous step S503.

In an exemplary implementation, a refractive index of the second light transmitting material is higher than the refractive index of the planarization layer 132 obtained from subsequent preparation.

S505: removing the sacrificial structure to obtain a second lens structure.

The second lens structure 133 obtained by this step S505 includes a fourth surface away from the light emitting device layer 110, a fifth surface close to the light emitting device layer 110, and a sixth surface connecting the fourth surface and the fifth surface. A projection of the fifth surface on the plane where the encapsulation layer 120 is located is within a projection of the fourth surface on the plane where the encapsulation layer 120 is located. That is, the second lens structure 133 may form a trapezoidal cross section with its upper surface close to the light emitting device layer 110 and its lower surface away from the light emitting device layer 110.

S506: forming a planarization layer on the first lens structure, the second lens structure, and the exposed encapsulation layer.

The structure, principle and beneficial effects of the display panel prepared by the steps S501 to S506 provided in the present exemplary embodiment have been described in detail in the previous exemplary embodiments and will not be repeated here.

The exemplary embodiments of the present disclosure may at least achieve the following beneficial effects:

1. the optical adjustment layer 130 of the display panel 100 adopts a light adjustment structure including the first lens structure 131 and the planarization layer 132. A refractive index of the first lens structure 131 is different from a refractive index of the planarization layer 132. By correcting light by using a critical surface between the first lens structure 131 and the planarization layer 132, it is possible to adjust the incident angle of light on the critical surface between the inner and outer optical path regions of the display apparatus, reduce the probability or degree of total internal reflection, and improve the light emitting efficiency of the display apparatus.
2. in the optical adjustment layer 130 of the display panel 100, at least a portion of the surface of the first lens structure 131 away from the light emitting device layer 110 has an undulating morphology 10. That is, by improving the roughness of a contact surface between the first lens structure 131 and the planarization layer 132, the adhesion between the first lens structure 131 and the planarization layer 132 is improved, and the probability of possible falling off between the first lens structure 131 and the planarization layer 132 is reduced, thereby reducing undesirable phenomena such as bubbles or cracks, improving display effect, improving product reliability and prolonging product life.
3. in the display panel 100, the optical adjustment layer 130 is located on a side of the encapsulation layer 120 away from the light emitting device layer 110, that is, an EES structure is adopted, which is beneficial to ensuring the encapsulation effect of the encapsulation layer 120 on the light emitting device layer 110 and improving the stability and durability of the product.
4. the first lens structure 131 having a relatively low refractive index is positioned around the light emitting region, and a portion of the planarization layer 132 having a relatively high refractive index is filled in the light emitting region. The incident angle of the light emitted from the light emitting device layer 110 on the critical surface between the inner and outer optical path regions of the display apparatus can be adjusted or restricted by using the principle of total reflection, thereby reducing the total internal reflection of the light in the squint direction, reducing the probability or degree of total internal reflection, and improving the light emitting efficiency of the display apparatus.
5. the projection of the first surface of the first lens structure 131 on the plane where the encapsulation layer 120 is located is within the projection of the second surface of the first lens structure 131 on the plane where the encapsulation layer 120 is located. That is, a trapezoidal cross section with its upper surface away from the light emitting device layer 110 and its lower surface close to the light emitting device layer 110 can be formed, which is beneficial to reduce an included angle between a large-angle light emitted from the light emitting device layer 110 and a small-angle light (main light path) after total reflection at the third surface (the critical surface between the planarization layer 132 and the first lens structure 131). That is, the large-angle light is corrected to the small-angle light by using the third surface of the first lens structure 131 to improve the light emitting efficiency.
6. the second lens structure 133 having a refractive index higher than that of the planarization layer 132 is disposed in the light emitting region, so that a critical surface between the second lens structure 133 and the planarization layer 132 can also adjust the large-angle light emitted from the light emitting device layer 110. The angle of a portion of the large-angle light entering the planarization layer 132 from the second lens structure 133 is reduced, that is, the angle between the large-angle light and the small-angle light (main light path) is reduced, thereby improving the light emitting efficiency.
7. the second lens structure 133 and the first lens structure 131 are separated by a portion of the planarization layer 132. On the one hand, two levels of total reflection critical surfaces can be formed between the second lens structure 133 and the first lens structure 131 (one level of total reflection critical surface is formed between the second lens structure 133 and the planarization layer 132, and the other level of total reflection critical surface is formed between the planarization layer 132 and the first lens structure 131), and these total reflection critical surfaces can cooperate to correct light and improve light emitting efficiency. On the other hand, the contact area of the whole of the second lens structure 133 and the first lens structure 131 with the planarization layer 132 can be increased, so that the adhesion between the whole of the first lens structure 131 and the second lens structure 133 and the planarization layer 132 in the optical adjustment layer 130 can be improved, and the probability that the film structure in the optical adjustment layer 130 may fall off can be reduced, thereby reducing undesirable phenomena such as bubbles or cracks, improving display effect, improving product reliability and prolonging product life.
8. the projection of the fifth surface of the second lens structure 133 on the plane where the encapsulation layer 120 is located is within the projection of the fourth surface on the plane where the encapsulation layer 120 is located. That is, a trapezoidal cross section with its upper surface close to the light emitting device layer 110 and its lower surface away from the light emitting device layer 110 can be formed, which is beneficial to reduce the probability that the sixth surface of the second lens structure 133 (the critical surface between the second lens structure 133 and the planarization layer 132) causes excessive adjustment of the light emitted from the light emitting device layer 110, allows some light at reasonable angle to pass normally, and can also improve the light emitting efficiency.

Those skilled in the art can understand that acts, measures and solutions in various operations, methods, and the process already discussed in the present disclosure may be alternated, changed, combined or deleted. Further, other acts, measures and solutions in various operations, methods and processes already discussed in the present disclosure may also be alternated, changed, rearranged, divided, combined or deleted. Further, acts, measures and schemes in the prior arts having various operations, methods and processes disclosed in the present disclosure may also be alternated, changed, rearranged, divided, combined or deleted.

In descriptions of the present disclosure, orientations or positional relationships indicated by terms "center", "upper", "lower", "front", "back", "left", "right", "vertical", "horizontal", "top", "bottom", "inside", "outside", and the like are based on exemplary orientations or positional relationships shown in the drawings, and are for convenience of describing the embodiments of the present disclosure or simplifying the description, but are not intended to indicate or imply that a referred apparatus or component must have a specific orientation, or is constructed and operated in a particular orientation, and therefore should not be construed as limitations on the present disclosure.

Terms "first" and "second" are only used for description and should not be construed as indicating or implying relative importance or implicitly indicating the number of indicated technical features. Therefore, features defined by "first" or "second" may explicitly or implicitly include one or more such features. In the descriptions of the present disclosure, "multiple" means two or more than two, unless otherwise specified.

In the description of the present disclosure, unless otherwise clearly specified and defined, the terms "install", "connect", "couple" should be broadly interpreted. For example, it may be a fixed connection or may be a detachable connection, or an integrated connection; it may be a direct connection, or may be an indirect connection through an intermediary, or may be an internal connection between two elements. Those of ordinary skills in the art may understand meanings of the aforementioned terms in the present disclosure according to situations.

The specific features, structures, materials, or characteristics described in the description may be combined in any one or more embodiments or examples in a proper way.

Although the steps in the flowchart of the drawings are shown sequentially as indicated by the arrows, the order of implementation of these steps is not limited to the order indicated by the arrows. Unless explicitly stated herein, in some implementation scenarios of embodiments of the present disclosure, the steps in the processes may be performed in other order as required. Further, some or all of the steps in each flowchart may include a plurality of sub-steps or a plurality of stages based on the actual implementation scenario. Part or all of the sub-steps or stages may be performed at the same time or at different times. Under different scenarios of performing time, the performing sequence of the sub-steps or stages may be flexibly configured as needed, and the embodiments of the present disclosure are not limited to this.

The above description is only a portion of the implementations of the present disclosure, and it should be pointed out that for those of ordinary skill in the art, adopting other similar implementation means based on the technical idea of the present disclosure also belongs to the protection scope of the embodiments of the present disclosure without departing from the technical conception of the solutions of the present disclosure.

The invention claimed is:

1. A display panel, comprising a light emitting device layer, an encapsulation layer, and an optical adjustment layer that are sequentially stacked;

wherein the optical adjustment layer comprises a first lens structure located on a side of the encapsulation layer away from the light emitting device layer, and a planarization layer located on a side of the first lens structure away from the light emitting device layer and on a side of an exposed encapsulation layer away from the light emitting device layer;

wherein at least a portion of a surface of the first lens structure away from the light emitting device layer has an undulating morphology; and wherein the optical adjustment layer further comprises a second lens structure, and the second lens structure and the first lens structure are separated by a portion of the planarization layer, and wherein one level of total reflection critical surface is formed between the second lens structure and the planarization layer, and another level of total reflection critical surface is formed between the planarization layer and the first lens structure.

2. The display panel according to claim 1, wherein the light emitting device layer comprises a pixel definition structure, and a pixel unit enclosed by the pixel definition structure;

a projection of the first lens structure on a plane where the encapsulation layer is located is within a projection of the pixel definition structure on the plane where the encapsulation layer is located;

a refractive index of the first lens structure is smaller than a refractive index of the planarization layer.

3. The display panel according to claim 2, wherein the pixel unit comprises a cathode layer, an electron transport layer, a light emitting layer, a hole transport layer and an anode layer; or the pixel unit comprises a backlight layer, an array substrate and a liquid crystal encapsulation layer.

4. The display panel according to claim 2, wherein the first lens structure comprises: a first surface away from the light emitting device layer, a second surface close to the light emitting device layer, and a third surface connecting the first surface and the second surface;

a projection of the first surface on the plane where the encapsulation layer is located is within a projection of the second surface on the plane where the encapsulation layer is located;

the undulating morphology is formed on the first surface.

5. The display panel according to claim 4, wherein the third surface is a smooth surface.

6. The display panel according to claim 2, wherein the undulating morphology comprises: protrusions and depressions alternately distributed;

a projection of the protrusions on the plane where the encapsulation layer is located and a projection of the depressions on the plane where the encapsulation layer is located both surround a projection of the pixel unit on the plane where the encapsulation layer is located.

7. The display panel according to claim 6, wherein the undulating morphology comprises at least one of the following features:

at least one of the projection of the protrusions on the plane where the encapsulation layer is located and the projection of the depressions on the plane where the encapsulation layer is located comprises a ring-shaped projection; and at least one of the projection of the protrusions on the plane where the encapsulation layer is located and the projection of the depressions on the plane where the encapsulation layer is located comprises at least two segment-shaped projections with end-to-end spacing.

8. The display panel according to claim 7, wherein the projection of the protrusions on the plane where the encapsulation layer is located and the projection of the depressions on the plane where the encapsulation layer is located are all located on different ring-shaped projection profiles which are coaxial but have different sizes, and are distributed alternately on different ring-shaped projection profiles; or the projection of the protrusions on the plane where the encapsulation layer is located and the projection of the depressions on the plane where the encapsulation layer is located are all located on the same ring-shaped projection profile and alternately distributed on the ring-shaped projection profile.

9. The display panel according to claim 2, wherein the second lens structure is located between the encapsulation layer and a portion of the planarization layer;

a projection of the second lens structure on the plane where the encapsulation layer is located is within the projection of the pixel unit on the plane where the encapsulation layer is located;

a refractive index of the second lens structure is greater than the refractive index of the planarization layer.

10. The display panel according to claim 9, wherein the second lens structure comprises: a fourth surface away from the light emitting device layer, a fifth surface close to the light emitting device layer, and a sixth surface connecting the fourth surface and the fifth surface;

a projection of the fifth surface on the plane where the encapsulation layer is located is within a projection of the fourth surface on the plane where the encapsulation layer is located.

11. The display panel according to claim 10, wherein the sixth surface is a smooth surface; and/or the fourth surface and the fifth surface are smooth surfaces.

12. The display panel according to claim 1, wherein the light emitting device layer comprises a pixel definition structure, and a pixel unit enclosed by the pixel definition structure;

a projection of the first lens structure on a plane where the encapsulation layer is located is within a projection of the pixel definition structure on the plane where the encapsulation layer is located;

the second lens structure is located between the encapsulation layer and a portion of the planarization layer; a projection of the second lens structure on the plane where the encapsulation layer is located is within a projection of the pixel unit on the plane where the encapsulation layer is located;

a refractive index of the first lens structure and a refractive index of the second lens structure are both larger than a refractive index of the planarization layer.

13. A display apparatus, comprising the display panel of claim 1.

14. A manufacturing method for a display panel, comprising:

preparing a light emitting device layer and forming an encapsulation layer on a side of the light emitting device layer;

preparing a first lens structure on the encapsulation layer and making at least a portion of a surface of the first lens structure away from the light emitting device layer have an undulating morphology; and forming a planarization layer on the first lens structure and on an exposed encapsulation layer;

further comprising:

preparing a second lens structure, wherein the second lens structure and the first lens structure are separated by a portion of the planarization layer, and wherein one level of total reflection critical surface is formed between the second lens structure and the planarization layer, and another level of total reflection critical surface is formed between the planarization layer and the first lens structure.

15. The manufacturing method according to claim 14, wherein preparing a first lens structure on the encapsulation layer and making at least a portion of a surface of the first lens structure away from the light emitting device layer have an undulating morphology comprises:

preparing a first lens structure on the encapsulation layer; and exposing at least a portion of the surface of the first lens structure away from the light emitting device layer using a half tone mask to form the undulating morphology.

16. The manufacturing method according to claim 14, wherein preparing a first lens structure on the encapsulation layer and making at least a portion of a surface of the first lens structure away from the light emitting device layer have an undulating morphology comprises:

forming a first light transmitting layer on the encapsulation layer;

performing plasma gas bombardment on at least a portion of a surface of the first light transmitting layer using a mask to form the undulating morphology on the at least a portion of the surface; and patterning the first light transmitting layer to obtain the first lens structure.

17. The manufacturing method according to claim 14, wherein preparing a first lens structure on the encapsulation layer and making at least a portion of a surface of the first lens structure away from the light emitting device layer have an undulating morphology comprises:

preparing a first lens structure on the encapsulation layer, wherein the first lens structure comprises a first surface away from the light emitting device layer, a second surface close to the light emitting device layer, and a third surface connecting the first surface and the second surface, and a projection of the first surface on a plane where the encapsulation layer is located is within a projection of the second surface on the plane where the encapsulation layer is located;

preparing a photoresist structure on the third surface of the first lens structure; and wet-etching the first surface of the first lens structure with the photoresist structure as a mask to form the undulating morphology on the first surface.

18. The manufacturing method according to claim 14, wherein preparing a second lens structure comprises: prior to forming a planarization layer on the first lens structure and on an exposed encapsulation layer, preparing a sacrificial structure on the exposed encapsulation layer, wherein a projection of the sacrificial structure on a plane where the encapsulation layer is located is within a projection of a pixel definition structure of the light emitting device layer on the plane where the encapsulation layer is located, the sacrificial structure comprises a seventh surface away from the light emitting device layer, an eighth surface close to the light emitting device layer, and a ninth surface connecting the seventh surface and the eighth surface, and a projection of the seventh surface on the plane where the encapsulation layer is located is within a projection of the eighth surface on the plane where the encapsulation layer is located;

coating a second light transmitting material between adjacent sacrificial structures, wherein a refractive index of the second light transmitting material is greater than a refractive index of the planarization layer; and removing the sacrificial structure to obtain the second lens structure.

19. A manufacturing method for a display panel, comprising:

preparing a light emitting device layer and forming an encapsulation layer on a side of the light emitting device layer;

preparing a first lens structure on the encapsulation layer and making at least a portion of a surface of the first lens structure away from the light emitting device layer have an undulating morphology;

preparing a sacrificial structure on an exposed encapsulation layer;

coating a second light transmitting material between adjacent sacrificial structures;

removing the sacrificial structure to obtain a second lens structure; and forming a planarization layer on the first lens structure, the second lens structure, and the exposed encapsulation layer;

wherein the second lens structure and the first lens structure are separated by a portion of the planarization layer, and wherein one level of total reflection critical surface is formed between the second lens structure and the planarization layer, and another level of total reflection critical surface is formed between the planarization layer and the first lens structure.

* * * * *